United States Patent [19]
Schlager et al.

[11] Patent Number: 5,486,788
[45] Date of Patent: Jan. 23, 1996

[54] CHOPPER STABILIZED OPERATIONAL TRANSCONDUCTANCE AMPLIFIER

[75] Inventors: Karl M. Schlager, Campbell, Calif.; Solomon K. Ng, Singapore, Singapore

[73] Assignee: SGS-Thomson Microelectronics, Inc., Carrollton, Tex.

[21] Appl. No.: 320,142

[22] Filed: Oct. 7, 1994

[51] Int. Cl.[6] .................... H03F 1/02; H03F 1/14
[52] U.S. Cl. ........................... 330/9; 330/51
[58] Field of Search ...................... 330/9, 51, 69; 327/362, 561

[56] References Cited

U.S. PATENT DOCUMENTS 5,047,727  9/1991  Theus ............................ 330/9

OTHER PUBLICATIONS

Michael C. W. Coln, "Chopper Stabilization of MOS Operational Amplifiers Using Feed–Forward Techniques", *IEEE Journal of Solid–State Circuits*, 1981, V. SC–16, No. 6, pp. 745–747.

*Primary Examiner*—Steven Mottola
*Attorney, Agent, or Firm*—Joseph Arrambide; Lisa K. Jorgenson; Richard K. Robinson

[57] ABSTRACT

A chopper stabilized current amplifier circuit is disclosed. The current amplifier circuit includes a main operational transconductance amplifier, a nulling transconductance amplifier, two capacitors, four switches, and a timing control circuit. The timing control circuit uses analog inverters to decrease the slew rate of the switching of the switches to decrease the noise in the system.

15 Claims, 5 Drawing Sheets

CHOPPER STABILIZED OPERATIONAL TRANSCONDUCTANCE AMPLIFIER

BACKGROUND OF THE INVENTION

1. Field of the Invention

This invention relates to current amplifiers and specifically to operational transconductance amplifiers (OTA), and more specifically to chopper stabilized operational transconductance amplifiers.

2. Description of the Relevant Art

The problem addressed by this invention is encountered in designing a current amplifier with a low offset current. Conventional techniques for building low-offset OTA's through careful matching and layout have limited effectiveness in MOS circuits, where threshold variations can occur between otherwise matched devices. Threshold variations are independent of other device characteristics and therefore, can be nulled only by direct measurement of the offset and the subsequent cancellation of the offset.

FIG. 1 shows a conventional arrangement of two operational amplifiers (opamps) in which the offset of one opamp is measured and subsequently canceled using the feed forward technique known in the art as chopper stabilization and is described in the IEEE Journal of Solid State Circuits Vol. SC-16, No.6 December 1981. Using the circuit in FIG. 1, the nulling amplifier 10 alternately zeros itself and the main amplifier 12, storing correction voltages on capacitor 14 and 16. More specifically, capacitor 14 is charged with the error voltage of nulling amplifier 10 when switches 4 and 6 are closed and switches 2 and 8 are open. Then, switches 4 and 6 open while switches 2 and 8 close to charge capacitor 16 to the error voltage. These error voltages on capacitors 14 and 16 drive the offset adjustment inputs (n) of the amplifiers 10 and 12, respectively. When switches 4–6 and 2–8 are switched at high frequencies, the response of the system reduces to that of the main amplifier 12 alone.

While this the prior art technique is useful for voltage opamps, it is problematic when used on operational transconductance amplifiers. Additionally, it has been observed that switching switches as described in the prior art creates undesired noise in an OTA system.

Therefore, it is an object of the invention to have a current amplifier circuit with a low offset voltage.

It is further an object of this invention to have a current amplifier circuit with low noise.

It is further an object of the invention to improve upon prior art chopper stabilized circuits by modifying known techniques so that they can work with OTA's.

SUMMARY OF THE INVENTION

The present invention meets the objects by providing a current amplifier circuit by modifying the chopper stabilized opamp technique such that it works for operational transconductance amplifiers. The circuit includes a main OTA, a nulling OTA, four switches, two capacitors, and a timing control circuit. The OTA's, switches, and capacitors are configured such that the offset current of the nulling amplifier is stored on one of the capacitors and then the offset is subtracted from the nulling and main OTA. To reduce the noise caused by the switching of the signals, analog inverters are use in the timing control circuit to increase the slew rate of the signals which drive the switches. Also, the timing of the switches are overlapped to further reduce the noise.

DETAILED DESCRIPTION OF THE PREFERRED EMBODIMENT

Figure 1:
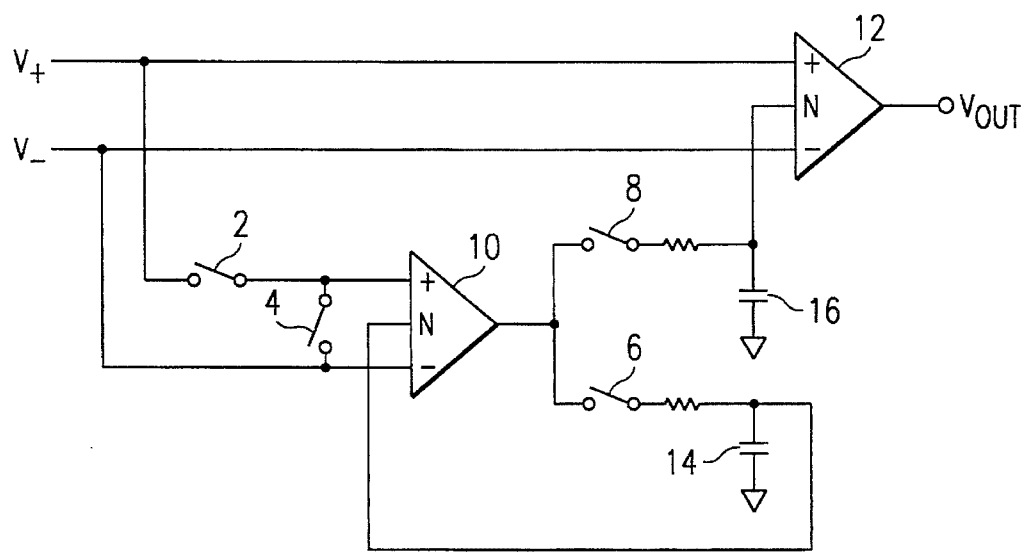
FIG. 1 is a chopper stabilized voltage amplifier as known in the prior art.
Figure 2A:
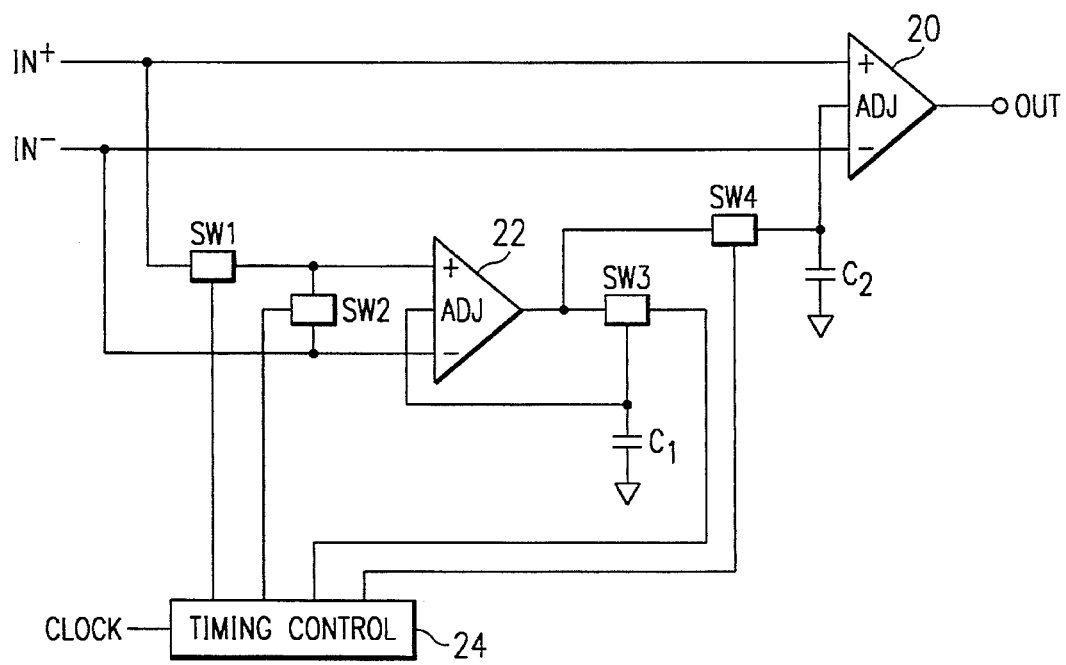
FIG. 2A is a block diagram of a current amplifier circuit in accordance with the present invention.

Referring now to FIG. 2a, a current amplifier circuit constructed according to a the preferred embodiment of the invention will be described. The current amplifier circuit has a main OTA 20 with a non-inverting input connected to a positive signal In+ and an inverting input connected to a negative signal In−. Switch sw1 has a conductive path between the non-inverting input of nulling OTA 22 and the signal In+ and is controlled by the timing control circuit. Switch sw2 is has a conductive path between the non-inverting input and the inverting input of the nulling OTA 22 and is also controlled by the timing control circuit 24. The inverting input of hulling OTA is connected to the In− signal. Switch sw3 has a conductive path between the output of the nulling OTA and the first plate of capacitor c1 which is connected to the offset adjustment input of the nulling OTA. Switch sw3 also is controlled by timing control circuit 24. The second plate of capacitor c1 is connected to a voltage reference, ground. Switch sw4 has a conductive path between the output of nulling OTA 22 and the first plate of capacitor c2 which is also connected to the offset adjustment input of the main OTA 20, and is controlled by the timing control circuit 24. The second plate of capacitor c2 is connected to ground.

Figure 2B:
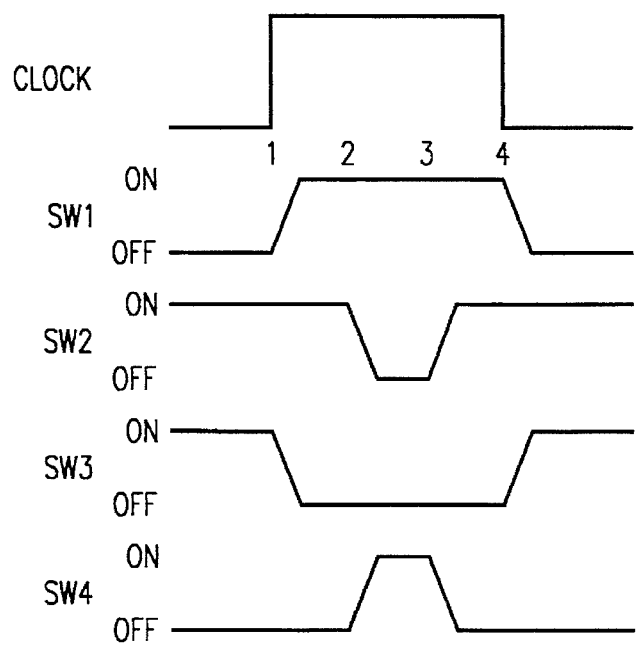
FIG. 2B is a timing diagram for the operation of the switches in FIG. 2A.

In operation, the timing control circuit switches switch sw1, sw2, sw3, and sw4 in accordance with table 1 below at a rate of around 100,000 hertz. The relative timing of the switching is illustrated in FIG. 2b.

| Phase | 1st Switch | 2nd Switch | 3rd Switch | 4th Switch |
|---|---|---|---|---|
| 1 | open | close | close | open |
| 2 | close | close | open | open |
| 3 | close | open | open | close |
| 4 | close | close | open | open |

During phase 1, the inputs to the nulling OTA 22 are connected together with closed switch sw2 while the output of the nulling OTA 22 is connected to capacitor c1 through closed switch sw3. Therefore, the offset current is stored on capacitor c1 and fed back into the offset adjustment input of the nulling OTA 22.

During phase 2, switches sw3 and sw4 are open which prevents the capacitors c1 and c2 from shorting together.

Also, switches sw1 and sw2 are closed which prevents the nulling OTA 22 from sensing an open circuit. It has been determined that overlapping switches sw1 and sw2 in the closed state significantly reduces transient currents at the output of the hulling OTA 22.

During phase 3, the nulling OTA 22 is receiving the differential input voltage In+ and In− and is charging capacitor c2 in response to the input voltages. Capacitor c2 is connected to the offset adjustment input of main OTA 20 to adjust the offset.

During phase 4, the transition is set up by turning on both input switches sw1 and sw2 while isolating capacitors c1 and c2. After phase 4, the cycle is repeated at a rate of around 100,000 hertz. At high frequencies, the response of the system reduces to that of the main amplifier 20 alone.

During the four phases, either or both switches sw1 or sw2 are closed, with no phase during which both switches sw1 and sw2 are off. Therefore, the input to nulling OTA 22 never senses a high impedance. Consequently, it has been observed that noise due to transient current spikes at the output of nulling OTA 22 is prevented. This circuit provides a chopper stabilized current amplifier with low chopper noise.

Figure 3:
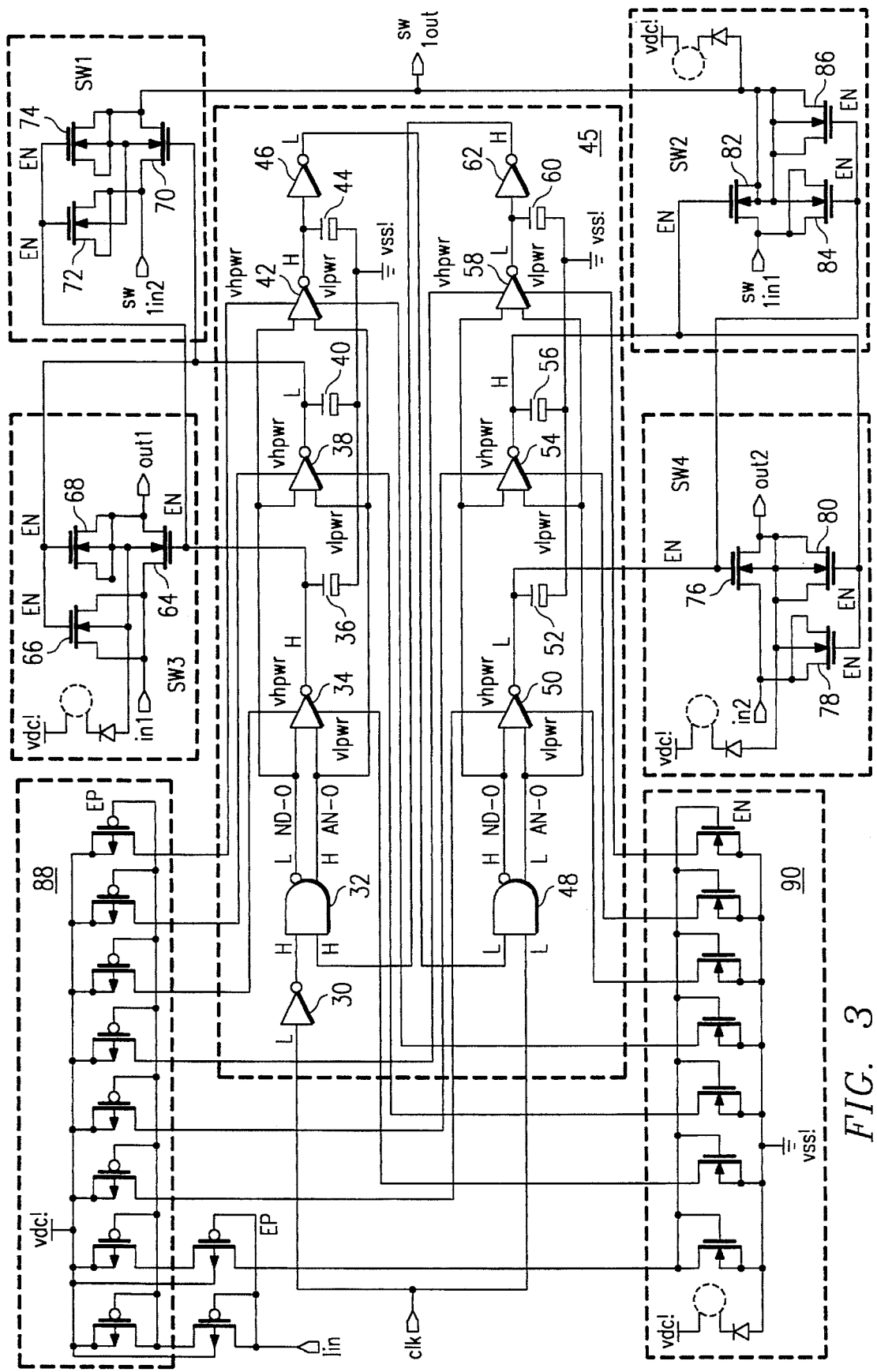
FIG. 3 is a schematic drawing of the timing control circuit and the switches of the current amplifier circuit in accordance with the present invention.

Referring now to FIG. 3, a logic control circuit constructed according to a the preferred embodiment of the invention will be described. The logic control circuit converts an input clock signal into the control signals for switches sw1, sw2, sw3, and sw4 in the sequence described in table 1 above and the timing diagram in FIG. 2b. The logic control circuit is constructed by connecting the clock signal to the input of inverter gate 30 and connecting the output of inverter gate 30 to an input of nand gate 32. Nand gate 32 has an inverted output connected to the non-inverting input of each of analog inverter 34 and analog inverter 42, and to the inverting input of analog inverter 38. The non-inverting output to nand gate 38 is connected to the inverting input of analog inverters 34 and 42 and to the non-inverting input of analog inverter 38. (The construction and operation of the analog inverters are described below and in FIG. 4). The output of analog inverter 34 is connected to the gates of n-channel transistors 64, 72, and 74 and the first plate of capacitor 36. The second plate of capacitor 36, 40, and 44 are connected to ground. The output to analog inverter 38 is connected to the gates of n-channel transistors 66, 68, and 70 and the first plate of capacitor 40. The output of analog inverter 42 is connected to the first plate of capacitor 44 and to the input of inverter gate 46. The output of inverter gate 46 is connected to the first input of nand gate 48. The second input to nand gate 48 is connected to the clock signal. The inverted output to nand gate 48 is connected to the non-inverted inputs of analog inverters 50 and 58 and to the inverted input of analog inverter 54. The non-inverted output to is connected to the inverted inputs to analog inverters 50 and 58 and the non-inverted input of analog inverter 54. The output of analog inverted 50 is connected to the first plate of capacitor 52 and the gates of n-channel transistors 76, 84, and 86. The second plates of capacitors 52, 56, and 60 are connected to ground. The output of analog inverter 54 is connected to the first plate of capacitor 56 and to the gates of n-channel transistors 78, 80 and 82. The output to analog inverter 58 is connected to the first plate of capacitor 60 and the input of inverter gate 62. The output of inverter gate 62 is connected to the second input of nand gate 32. Analog inverters 43, 38, 42, 50, 54, and 58 are to and powered by current sources 88 and 90.

In operation, the transistors 64, 66, and 68 operate as switch sw3 of FIG. 2a. Likewise, transistors 70, 72, and 74 operate as switch sw1, transistors 76, 78, 80 operate as switch sw4, and transistors 82, 84, and 86 operate as switch sw2. The timing control circuit 45 cascades the clock signal through the timing control circuit 45 such that the switches are controlled in accordance to table 1 above and the timing diagram in figure. The sequence of control is more specifically described in the timing control diagram of FIG. 2b.

In switch sw3, the conductive path is the source-drain path of n-channel transistor 64. Transistors 66 and 68 are configured in the switch to provide charge balancing which effectively decreases the slew rate of transistor 64. Consequently, the noise in the current amplifier is reduced. Similarly, transistors 70, 82, and 76 provide the source-drain current path for switches sw1, sw2, and sw4, respectively. Transistors 72–74, 84–86, and 78–80 provide the charge balancing for switches sw1, sw2, and sw4, respectively.

Noise from the timing control circuit is also reduced by reducing the slew rate of analog inverters 34, 38, 42, 50, 54, and 58. The slew rate is reduced by current limiting the power to the analog inverters by powering the analog inverters with current sources 88 and 90 and by loading the outputs with capacitors 36, 40, 44, 52, 56, and 60. By current limiting the analog inverters and loading their outputs, the switches are controlled with an analog signal which has a relatively slow slew rate which reduces the noise in the current amplifier circuit.

Figure 4:
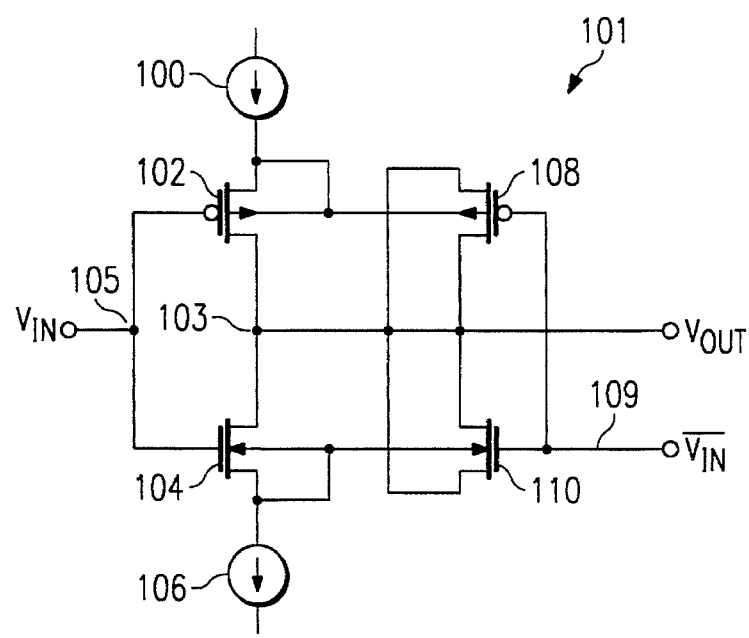
FIG. 4 is a schematic drawing of the analog inverter of the timing control circuit in accordance with the present invention.

Referring now to FIG. 4, an analog inverter 101 constructed according to a the preferred embodiment of the invention will be described. This analog inverter is used in the timing control circuit 45 in FIG. 3 as analog inverters 34, 38, 42, 50, 54, and 58. The source of a current source 100 is connected to the drain and body of an p-channel transistor 102. The source of transistor 102 is connected the drain of n-channel transistor 104 and the output node 103. The gates of transistors 102 and 104 are connected to input node 105. The source of transistor 104 is connect to its body, the body of transistor 110, and to the drain of current source 106. Node 103 is also connected to the source and drain of transistor 108 and the source and drain of transistor 110. The gates of transistors 108 and 110 are connected to input node 109 which receives the inverted Vin signal.

In operation, the analog inverter 101 operates like a digital inverter with an slow output. When node 105 is high and node 109 is low, node 103 is low. Conversely, when node 105 is low and node 109 is high, node 103 is high. Transistors 102 operate together as a typical inverter as is known in the art. However, transistors 108 and 110 are configured to provide charge balancing by acting as body to source and body to drain capacitors which effectively reduce the slew rate of the output. The current sources 100 and 106 provide additional reduction in slew rate by limiting the current available to the inverter. Consequently, analog inverter 101 operates as an inverter with a relatively slow transition time.

Figure 5:
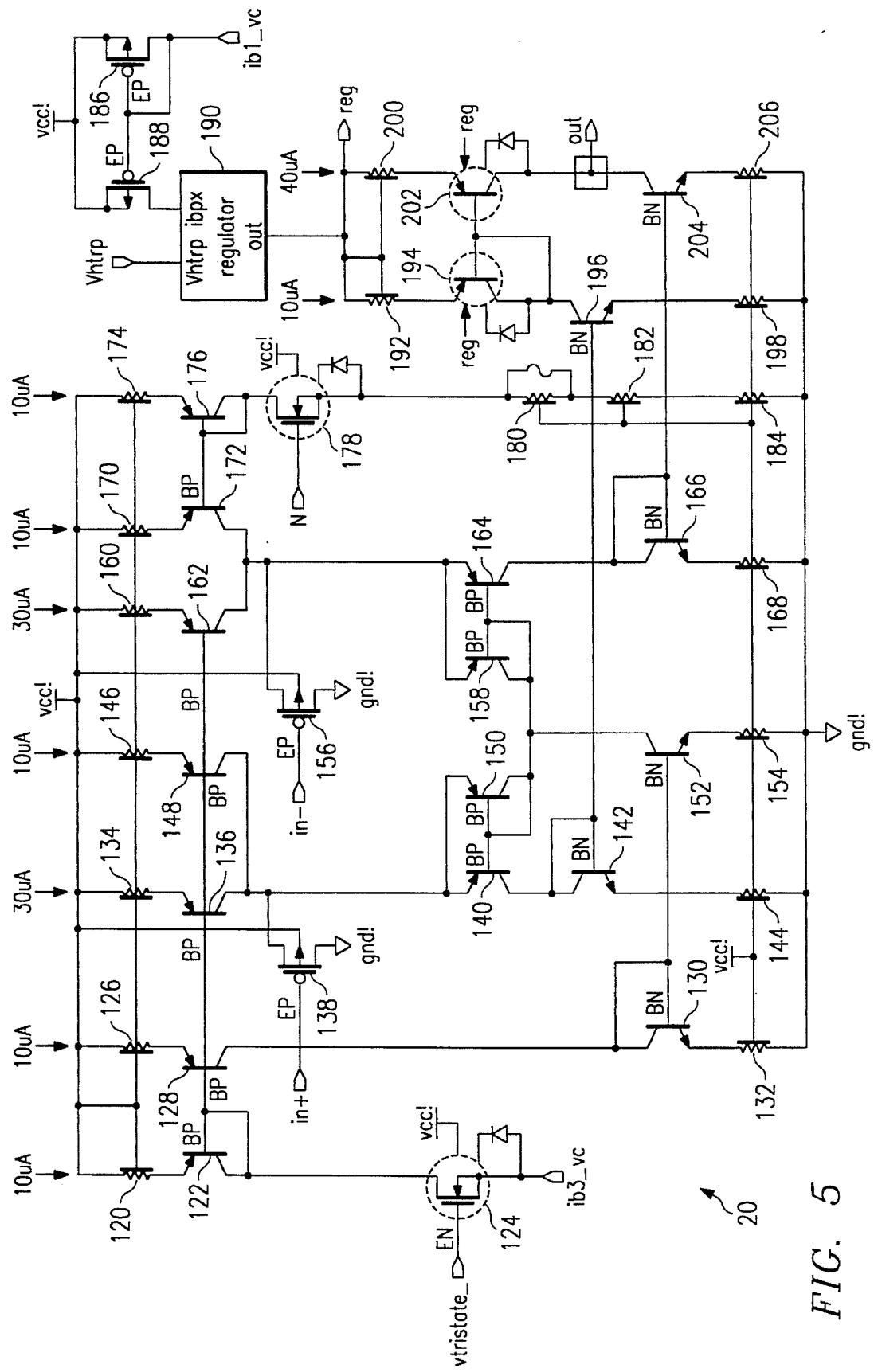
FIG. 5 is a schematic drawing of the nulling OTA of the current amplifier circuit in accordance with the present invention.

Referring now to FIG. 5, the main OTA 20 constructed according to a the preferred embodiment of the invention will be described. The first end of resistor 120 is connected to Vcc and the second end is connected to the emitter of PNP transistor 122. The base of transistor 122 is connected to its collector and to the base of PNP transistors 128, 136, 148, and 162 and to the drain to N-channel transistor 124. The base of transistor 124 is connected to an enable signal while its source is connected to a bias current circuit.

The first end of resistor 126 is connected to Vcc while the second end of resistor 126 is connected to the emitter of PNP transistor 128. The collector of transistor 128 is connected to the collector of transistor of NPN transistor 130. The base of transistor 130 is connected to its collector and to the base of NPN transistor 152. The first end of resistor 132 is connected to the emitter of resistor 130 while the second end of resistor 132 is connected to voltage reference, ground.

The first end of resistor 134 is connected to Vcc while the second end of resistor 134 is connected to the emitter of PNP transistor 136. The collector of transistor 136 is connected to the collector of transistor 148, to the drain of P-channel transistor 138, and to the emitter of PNP transistor 140 and the emitter of PNP transistor 150. The first end of resistor 146 is connected to Vcc while the second end of resistor 146 is connected to the emitter of transistor 148. The base of transistor 140 is connected to the base and collector of transistor 150 and to the gate of PNP transistors 158 and 164 and to the collector of transistor 158. The collector of transistor 140 is connected to the collector and base of NPN transistor 142. The emitter of transistor 142 is connected to the first end of resistor 144 while the second end of resistor 144 is connected to ground. The gate of transistor 138 is connected to the input voltage signal while the drain of transistor 138 is connected to ground.

The first end of resistor 160 is connected to Vcc while the second end of resistor 160 is connected to the emitter of transistor 162. The collector of transistor 162 is connected the collector of PNP transistor 172, the drain of P-channel transistor 156, the emitter of PNP transistor 164 and the emitter of PNP transistor 158. The gate of transistor 156 is connected to the inverted input voltage signal while the drain of transistor 156 is connected to ground. The collector of transistor 164 is connected to the collector and base of NPN transistor 166. The first end of resistor 168 is connected to the emitter of transistor 166 while the second end of resistor 168 is connected to ground.

The first end of resistor 170 is connected to Vcc while the second end of resistor 170 is connected to the emitter of transistor 172. The first end of resistor 174 is connected to Vcc while the second end of resistor 174 is connected to the emitter of PNP transistor 176. The base of transistor 176 is connected to its emitter, the base of transistor 172, and the drain of N-channel transistor 178. The gate of transistor 178 is connected to the offset adjustment signal. The first end of resistor 180 is connected to the source of transistor 178 while the second end of resistor 180 is connected to the first end of resistor 182. The second end of resistor 182 is connected to the first end of resistor 184 while the second end of resistor 184 is connected to ground.

The drains of P-channel transistors 186 and 188 are connected to Vcc. The gates of transistors 188 and 186 and the source of transistor 186 are connected to a bias current signal. The source of transistor 188 is connected to the regulator 190. The output to regulator 190 is connected to the first ends of resistor 192 and resistor 200. The second end of resistor 192 is connected to the emitter of PNP transistor 194. The base and collector of transistor 194 is connected to the base of PNP transistor 202 and to the collector of NPN transistor 196. The emitter of transistor 196 is connected to the first end of resistor 198 which has its other end connected to ground. The second end of resistor 200 is connected to the emitter of transistor 202. The collector of transistor 202 is connected to the collector of NPN transistor 204 and the output node of the main OTA. The emitter of transistor 204 is connected to the first end of resistor 206 which has a second end connected to ground.

In operation, the main OTA basically has an input stage and an output stage. The input stage is comprised of a differential input stage, which has a non-inverted input stage and an inverted input stage, the current bias circuit, and the offset input stage.

The non-inverted input stage is comprised of transistors 138, 140, 142, and 150. The inverted input stage is comprised of transistors 156, 158, 164, and 164. When more voltage is on the non-inverting input In+ relative to the inverting input In−, then more current will flow through transistors 138, 140, 142, and 150 than transistors 156, 158, 164, and 164. Conversely, when less voltage is on the non-inverting input relative to the inverting input, then less current will flow through transistors 138, 140, 142, and 150 than transistors 156, 158, 164, and 164.

When more current runs through transistor 142 than through transistor 166, the output stage supplies current since transistor 196 conducts more than transistor 204 which causes transistors 192, 194 and 202 to turn on more than transistor 204. Conversely, output stage provides less current or sinks current when transistor 196 conducts less current than transistor 204 since transistor 202 will be driving less current while transistor 204 is conducting more.

The bias currents for the differential stage are set by transistors 122, 124, 128, 136, 148, and 162. More specifically, a bias current signal is received by the source of transistor 124 which controls the current through resistors 120 and transistor 122. Since the gates of transistors 122, 128, 136, 148 and 162 are tied together, the current through transistor 122 is mirrored through to transistors 122, 128, 136, 148 and 162. In the preferred embodiment, a bias current signal is selected such that around 10 microamps is conducted through transistor 122, 128, and 148, and around 30 microamps through transistor 136 and 162.

The offset input signal N is received by the gate of transistor 178 which controls the current in transistors 178 which is current mirrored to 172. The bias current for the inverting input is generated through transistors 162 and 172. Transistor 162 supplies around 30 microamps and transistor 172 is supplies around 10 microamps, depending in the offset input signal. Since the non-inverting input is biased with around 40 microamps, the differential input can be balanced with the offset input signal.

The output stage is powered by transistors 186, 188, and regulator 190. The output current is either supplied by transistor 202 or sunk by transistor 204, depending on the base current of transistor 196 relative the base current transistor 204, as described above.

Figure 6:
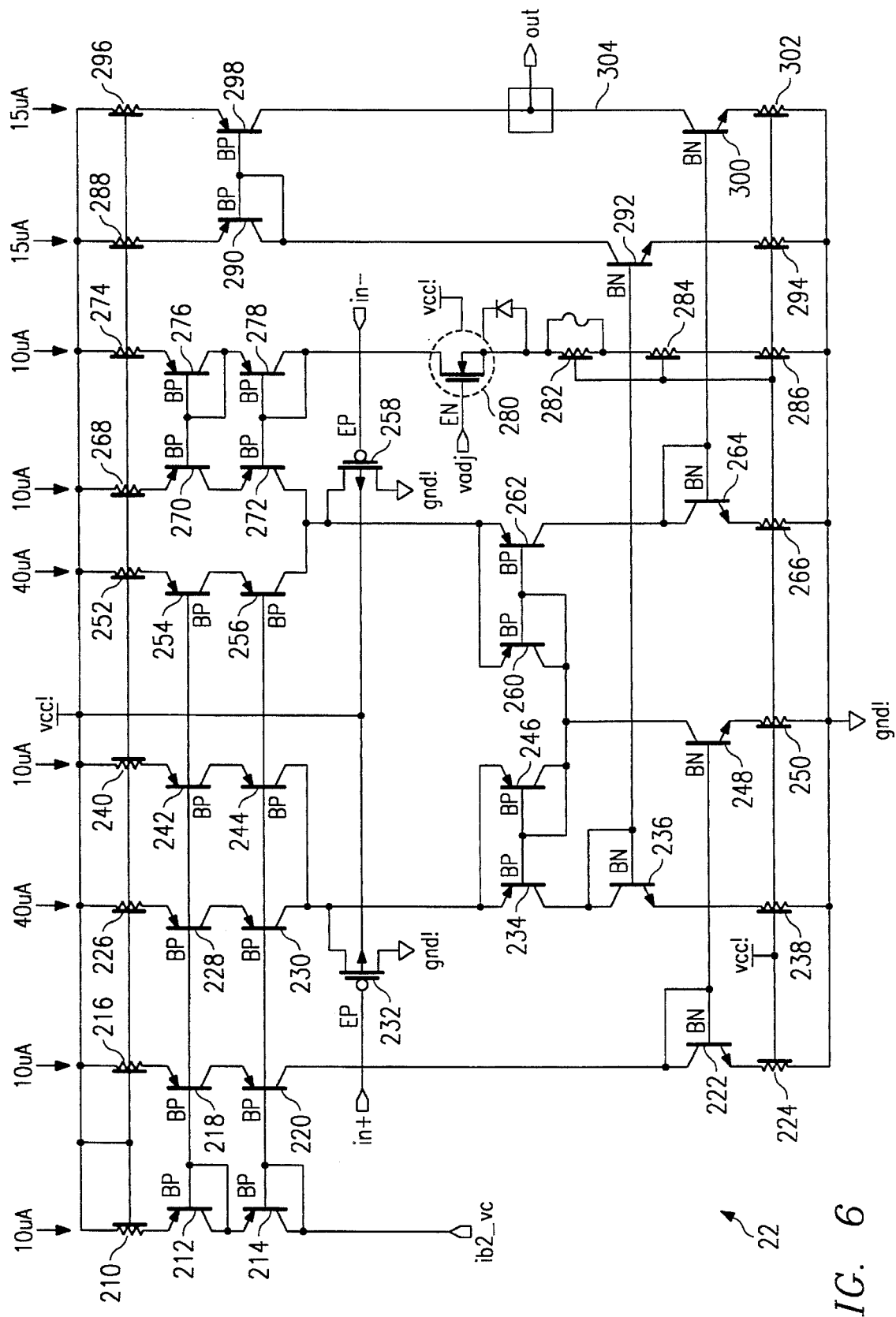
FIG. 6 is a schematic drawing of the main OTA of the current amplifier circuit in accordance with the present invention.

Referring now to FIG. 6, the nulling OTA 22 constructed according to the preferred embodiment is described. Resistor 210 has a first end connected to Vcc and has a second end connected to the emitter of PNP transistor 212. The base to transistor 212 is connected its collector, to the emitter of PNP transistor 214, and to the bases of PNP transistors 218, 228, 242, and 254. The gate of transistor 214 is connected to its collector, to the base of transistor 220, the base to PNP transistor 230, the base to PNP transistor 244, and the base to PNP transistor 256.

One end of resistor 216 is connected to Vcc while the other end is connected to the emitter of transistor 218. The collector of transistor 218 is connected to the emitter of transistor 220. The collector of transistor 220 is connected to the collector and base of transistor 222. The emitter of transistor 222 is connected to the first end of resistor 224 while the second end of resistor 224 is connected to a voltage reference, ground. The first end of resistor 226 is connected to Vcc while the second end is connected to the emitter of PNP transistor 228. The collector of transistor 228 is connected to the emitter of transistor 230. The collector of transistor 230 is connected to the collector of transistor 244, the drain of P-channel transistor 232, and the emitter of transistors 234 and 246. The gate of transistor 232 is connected to the non-inverting input signal while the source is connected to ground.

The first end of resistor 240 is connected to Vcc while the second end is connected to the emitter of transistor 242. The collector of transistor 242 is connected to the emitter of transistor 244. The collector of transistor 234 is connected to the collector and base of NPN transistor 236 and the base of NPN transistor 292. The first end of resistor 238 is connected to the emitter of transistor 236 while the second end of resistor 238 is connected to ground.

The first end of resistor 252 is connected to Vcc while the second end is connected to the emitter of PNP transistor 254. The collector of transistor 254 is connected to the emitter of transistor 256. The collector of transistor 256 is connected to the collector of PNP transistor 272 and the drain of P-channel transistor 258 and the emitters of PNP transistors 260 and 262. The gate of transistor 258 is connected to the inverting input signal while the source is connected to ground.

The first end of resistor 268 is connected to Vcc while the second end is connected to the emitter of PNP transistor 270. The collector of transistor 270 is connected to the emitter of PNP transistor 272. The gates of transistors 260 and 262 are connected to the collector of transistor 260, the collector of transistor 246, the collector of NPN transistor 248. The base of transistor 248 is connected to the collector and base of transistor 222. The first end of resistor 250 is connected to the emitter of transistor 248 while the second end is connected to ground. The collector of transistor 262 is connected to the collector and base of NPN transistor 264 and the base of NPN transistor 300. The first end of resistor 266 is connected to the emitter of transistor 264 while the second end is connected to ground.

The first end of resistor 274 is connected to Vcc while the second end is connected to the emitter of PNP transistor 276. The collector and base of transistor 278 are connected to the base of transistor 272 and the drain of N-channel transistor 280. The gate of transistor 280 is connected to the offset adjustment input signal. The source of transistor 280 is connected to the first end of resistor 282 while the second end is connected to the first end of resistor 284. The first end of resistor 286 is connected to the second end of resistor 284 while the second end is connected to ground.

The first end of resistor 288 is connected to Vcc while the second end is connected to the emitter of PNP transistor 290. The first end of 2.4K resistor 296 is connected to Vcc while the second end is connected to the emitter of PNP transistor 298. The base of transistor 298 is connected to the base and collector of transistor 290 and the collector of transistor 292. The emitter of transistor 292 is connected to the first end of resistor 294 while the second end is connected to ground. The first end of resistor 302 is connected to the emitter of transistor 300 while the second end is connected to ground. The collectors of transistors 298 and 300 are connected to the output node 304 of the nulling OTA.

In operation, the nulling OTA 22 is divided into a bias circuit, differential input, and output circuits. The bias circuit is comprised of the collector of transistor 214 receives the bias current which sets up the bias currents for the differential inputs. Resistor 216, transistor 218, and transistor 220 provide the bias current for transistor 222. Resistors 226 and 240 and transistors 228, 230, 242, and 244 provide the bias current for transistors 234 and 236. Resistors 252 and 268 and transistors 254, 256, 270, and 272 provide the bias current for transistors 260, 262, and 264. Resistor 274 and transistors 276 and 278 provide the bias current for transistor 280.

The differential input of the nulling OTA is comprised of transistors 232, 234, 236, 246, 258, 260, 262, and 264. The gate of transistor 232 receives the non-inverting input while the gate of transistor 258 receives the inverting input signals. When the voltage on the non-inverting input is higher than the voltage on the inverting input, transistor 232 is turned off which turns on transistors 234, 236 and 292 proportional to the difference in voltage. This in turn turns on transistors 290 and 298 which drives current through the output node of the OTA. Conversely, if the inverting input has a higher voltage than the non-inverting input, then transistors 260, 262, 264 conduct more than 234, 236, and 246, which turns on transistor 300 which sinks current from the output node 304. Consequently, the output pin provides a current output proportional to the difference between the non-inverting input pin and the inverting input pin.

In summary, the chopper stabilized operational amplifier as described in the invention offers the advantages of providing a current amplifier circuit with a low offset voltage low noise. The invention to improves upon prior art chopper stabilized circuits by modifying known techniques so that they can work with OTA's.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A current amplifier circuit comprising:

a nulling operational transconductance amplifier having an non-inverting input, having an inverting input, having an offset adjustment input, and having a current output;

a first capacitor having a first plate connected to the offset adjustment input of said nulling operational transconductance amplifier and having a second plate connected to a voltage reference;

a main operational transconductance amplifier having an non-inverting input connected to a first input voltage, having an inverting input connected to a second input voltage, having an offset adjustment input, and having a current output;

a second capacitor having a first plate connected to the offset adjustment input of said main operational transconductance amplifier and having a second plate connected to the voltage reference;

a first switch having a conductive path between the second voltage and the non-inverting input to said nulling operational transconductance amplifier, and having a control element;

a second switch having a conductive path between the non-inverting input of said nulling operational transconductance amplifier and the inverting input of said nulling operational transconductance amplifier and having a control element;

a third switch having a conductive path between the output of said nulling operational transconductance amplifier and the offset adjustment input of said nulling operational transconductance amplifier and having a control element;

a fourth switch having a conductive path between the output of said nulling operational transconductance amplifier and the offset adjustment of said main operational transconductance amplifier and having a control element; and a timing control circuit having a clock input for receiving a clock signal, having a first output connected to the control element of said first switch, having a second output connected to the control element of said second switch, having a third output connected to the control element of said third switch, and having a fourth output connected to the control element of said fourth switch, for causing said first, second, third, and fourth switches to conduct current such that the current amplifier circuit is chopper stabilized, wherein said timing control circuit controls said first, second, third, and fourth switches in four phases in accordance with the following table:

| Phase | 1st Switch | 2nd Switch | 3rd Switch | 4th Switch |
|---|---|---|---|---|
| 1 | off | on | on | off |
| 2 | on | on | off | off |
| 3 | on | off | off | on |
| 4 | on | on | off | off |

2. A current amplifier circuit comprising:

a nulling operational transconductance amplifier having an non-inverting input, having an inverting input, having an offset adjustment input, and having a current output;

a first capacitor having a first plate connected to the offset adjustment input of said nulling operational transconductance amplifier and having a second plate connected to a voltage reference;

a main operational transconductance amplifier having an non-inverting input connected to a first input voltage, having an inverting input connected to a second input voltage, having an offset adjustment input, and having a current output;

a second capacitor having a first plate connected to the offset adjustment input of said main operational transconductance amplifier and having a second plate connected to the voltage reference;

a first switch having a conductive path between the second voltage and the non-inverting input to said nulling operational transconductance amplifier, and having a control element;

a second switch having a conductive path between the non-inverting input of said nulling operational transconductance amplifier and the inverting input of said nulling operational transconductance amplifier and having a control element;

a third switch having a conductive path between the output of said nulling operational transconductance amplifier and the offset adjustment input of said nulling operational transconductance amplifier and having a control element;

a fourth switch having a conductive path between the output of said nulling operational transconductance amplifier and the offset adjustment of said main operational transconductance amplifier and having a control element; and a timing control circuit having a clock input for receiving a clock signal, having a first output connected to the control element of said first switch, having a second output connected to the control element of said second switch, having a third output connected to the control element of said third switch, and having a fourth output connected to the control element of said fourth switch, for causing said first, second, third, and fourth switches to conduct current such that the current amplifier circuit is chopper stabilized, wherein said timing control circuit further comprises a plurality of analog outputs for controlling said first, second, third, and fourth switches.

3. The circuit of claim 2 wherein said plurality of analog outputs are generated with a plurality of analog inverters.

4. The circuit of claim 3 wherein said plurality of analog inverters comprise a plurality of current sources for limiting the current available to the inverter and a plurality of capacitive circuit elements for reducing the slew rate of said plurality of analog inverters.

5. The circuit of claim 1 wherein said first switch, second switch, third switch, and fourth switch each comprise a transistor.

6. The circuit of claim 5 wherein said transistors comprise MOSFET transistors.

7. A current amplifier circuit comprising:

a nulling operational transconductance amplifier having an non-inverting input, having a inverting input, having an offset adjustment input, and having a current output;

a first capacitor having a first plate connected to the offset adjustment input of said nulling operational transconductance amplifier and having a second plate connected to a voltage reference;

a main operational transconductance amplifier having an non-inverting input connected to a first input voltage, having an inverting input connected to a second input voltage, having an offset adjustment input, and having a current output;

a second capacitor having a first plate connected to the offset adjustment input of said main operational transconductance amplifier and having a second plate connected to the voltage reference;

a first switch having a conductive path between the second voltage and the non-inverting input to said nulling operational transconductance amplifier, and having a control element;

a second switch having a conductive path between the non-inverting input of said nulling operational transconductance amplifier and the inverting input of said nulling operational transconductance amplifier and having a control element;

a third switch having a conductive path between the output of said nulling operational transconductance amplifier and the offset adjustment input of said nulling operational transconductance amplifier and having a control element;

a fourth switch having a conductive path between the output of said nulling operational transconductance amplifier and the offset adjustment of said main operational transconductance amplifier and having a control element; and a means for controlling said first, second, third and fourth switches, having a clock input for receiving a clock signal, having a first output connected to the control element of said first switch, having a second output connected to the control element of said second switch, having a third output connected to the control element of said third switch, and having a fourth output connected to the control element of said fourth switch, for causing said first, second, third, and fourth switches to conduct current such that the current amplifier circuit is chopper stabilized;

wherein said means for controlling said first, second, third and fourth switches controls said first, second, third, and fourth switches in four phases in accordance with the following table:

|   | 1st Switch | 2nd Switch | 3rd Switch | 4th Switch |
|---|---|---|---|---|
| 1 | off | on | on | off |
| 2 | on | on | off | off |
| 3 | on | off | off | on |
| 4 | on | on | off | off |

8. A current amplifier circuit comprising:

a nulling operational transconductance amplifier having an non-inverting input, having a inverting input, having an offset adjustment input, and having a current output;

a first capacitor having a first plate connected to the offset adjustment input of said nulling operational transconductance amplifier and having a second plate connected to a voltage reference;

a main operational transconductance amplifier having an non-inverting input connected to a first input voltage, having an inverting input connected to a second input voltage, having an offset adjustment input, and having a current output;

a second capacitor having a first plate connected to the offset adjustment input of said main operational transconductance amplifier and having a second plate connected to the voltage reference;

a first switch having a conductive path between the second voltage and the non-inverting input to said nulling operational transconductance amplifier, and having a control element;

a second switch having a conductive path between the non-inverting input of said nulling operational transconductance amplifier and the inverting input of said nulling operational transconductance amplifier and having a control element;

a third switch having a conductive path between the output of said nulling operational transconductance amplifier and the offset adjustment input of said nulling operational transconductance amplifier and having a control element;

a fourth switch having a conductive path between the output of said nulling operational transconductance amplifier and the offset adjustment of said main operational transconductance amplifier and having a control element; and a means for controlling said first, second, third and fourth switches, having a clock input for receiving a clock signal, having a first output connected to the control element of said first switch, having a second output connected to the control element of said second switch, having a third output connected to the control element of said third switch, and having a fourth output connected to the control element of said fourth switch, for causing said first, second, third, and fourth switches to conduct current such that the current amplifier circuit is chopper stabilized;

wherein said means for controlling said first, second, third and fourth switches comprises a plurality of analog outputs for controlling said first, second, third, and fourth switches.

9. The circuit of claim 8 wherein said plurality of analog outputs are generated with a plurality of analog inverters.

10. The circuit of claim 9 wherein said plurality of analog inverters comprise a plurality of current sources for limiting the current available to the inverter and a plurality of capacitive circuit elements for reducing the slew rate of said plurality of analog inverters.

11. The circuit of claim 7 wherein said first switch, second switch, third switch, and fourth switch each comprise a transistor.

12. The circuit of claim 11 wherein said transistors comprise MOSFET transistors.

13. A method for reducing the offset current of a current amplifier circuit comprising the steps of:

in a first phase, connecting a non-inverting and an inverting inputs of a nulling operational transconductance amplifier to each other and connecting an output of the nulling operational transconductance amplifier to an offset adjustment input of the nulling operational transconductance amplifier and to an offset adjustment input of a main operational transconductance amplifier;

in a second phase, connecting the non-inverting input of the nulling operational transconductance amplifier to a non-inverting input of the main operational transconductance amplifier and disconnecting the output of the nulling operational transconductance amplifier from the offset adjustment input of the nulling operational transconductance amplifier;

in the third phase, disconnecting the inputs of the hulling operational transconductance amplifier and disconnecting the output of the nulling operational transconductance amplifier from the offset adjustment input of the main operational transconductance amplifier;

in the fourth phase, disconnecting the non-inverting input of the nulling operational transconductance amplifier to the non-inverting input of the main operational transconductance amplifier and connecting the output of said nulling operational transconductance amplifier to the offset adjustment input of the hulling operational transconductance amplifier; and repeating phases one, two, three, and four, at a predetermined frequency;

wherein each of the steps of connecting one element to another further comprise the steps of driving a transistor to a state of conduction; and wherein each step of driving a transistor to a state of conduction further comprises driving said transistor with an analog signal.

14. The method in claim 13 wherein each step of driving a transistor to a state of conduction further comprises driving said transistor with an analog inverter.

15. The method in claim 13 wherein the steps of disconnecting one element to another further comprise the steps of driving a transistor to a state of non-conduction wherein the step of driving a transistor to a state of non-conduction further comprises driving said transistor with an analog signal.

* * * * *